(12) United States Patent
Little et al.

(10) Patent No.: US 8,328,946 B2
(45) Date of Patent: Dec. 11, 2012

(54) CONVEYOR ASSEMBLY WITH REMOVABLE ROLLERS FOR A VAPOR DEPOSITION SYSTEM

(75) Inventors: Edwin Jackson Little, Denver, CO (US); Christopher Rathweg, Louisville, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 422 days.

(21) Appl. No.: 12/649,621

(22) Filed: Dec. 30, 2009

(65) Prior Publication Data

US 2011/0155063 A1    Jun. 30, 2011

(51) Int. Cl.
 *C23C 16/458* (2006.01)
 *B65G 13/02* (2006.01)
 *B65G 13/07* (2006.01)
(52) U.S. Cl. ......... 118/729; 198/780; 198/790; 414/939
(58) Field of Classification Search .................. 118/729; 198/780, 790; 414/935, 936, 937, 938, 939, 414/940
See application file for complete search history.

(56) References Cited

U.S. PATENT DOCUMENTS

| | | | |
|---|---|---|---|
| 5,372,646 A | 12/1994 | Foote et al. | |
| 5,470,397 A | 11/1995 | Foote et al. | |
| 5,772,715 A | 6/1998 | McMaster et al. | |
| 6,547,922 B2 | 4/2003 | Hori et al. | |
| 2009/0194165 A1 | 8/2009 | Murphy et al. | |
| 2011/0155063 A1* | 6/2011 | Little et al. ................ | 118/729 |

* cited by examiner

*Primary Examiner* — Sylvia R. MacArthur
(74) *Attorney, Agent, or Firm* — Dority & Manning, P.A.

(57) ABSTRACT

A conveyor assembly for conveying substrates through a vapor deposition system includes a first carriage rail and a second carriage rail disposed at an opposite side of the conveyor assembly. The first and second carriage rails include a plurality of roller positions spaced longitudinally therealong. The carriage rails further include a pair of wheels at each of the roller positions, with the wheels spaced apart so as to define a cradle at the respective roller position. At least one of the wheels at each roller position on is drive wheel. A plurality of rollers extend between the first and second carriage rails. The rollers have ends that drop into the cradles at the roller positions such that the rollers are removable from the carriage rails by being lifted out of the cradles at the roller positions.

20 Claims, 4 Drawing Sheets

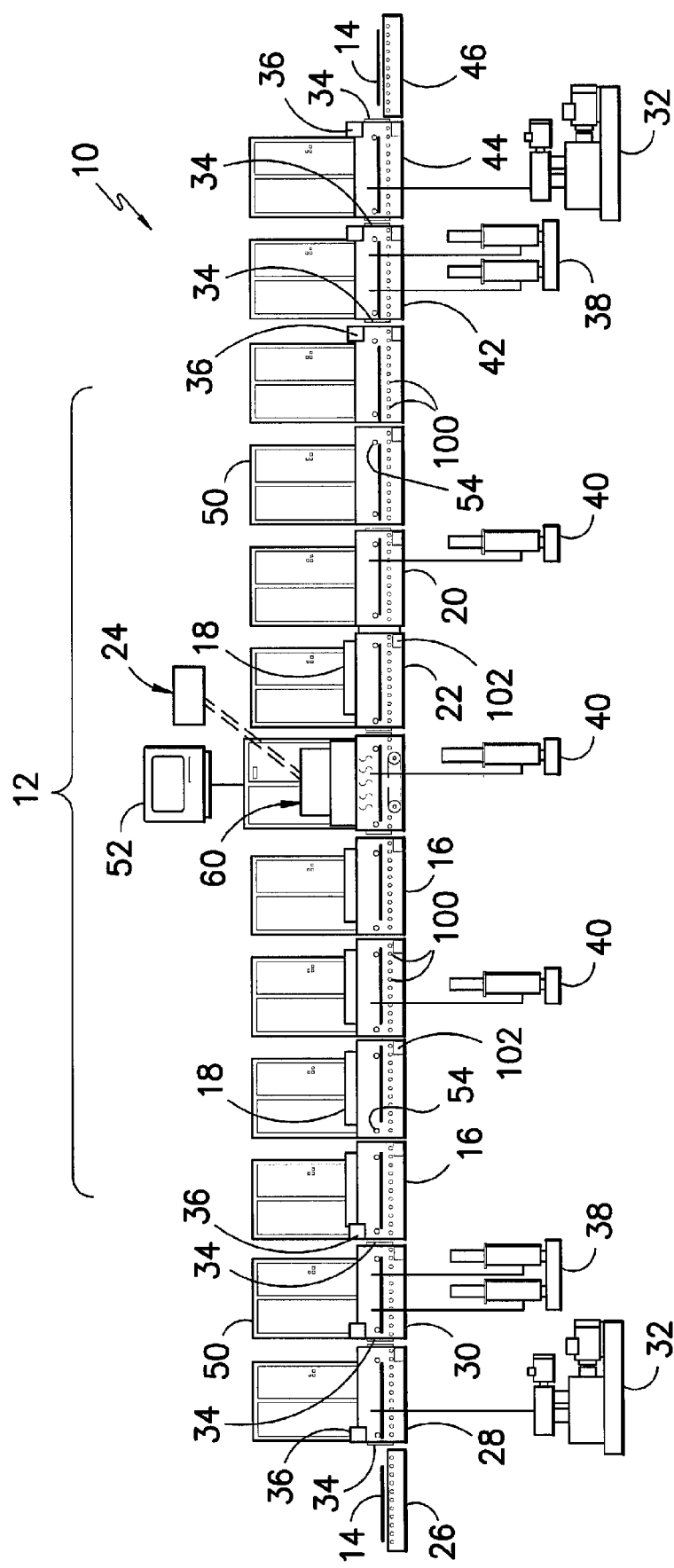
FIG. -1-

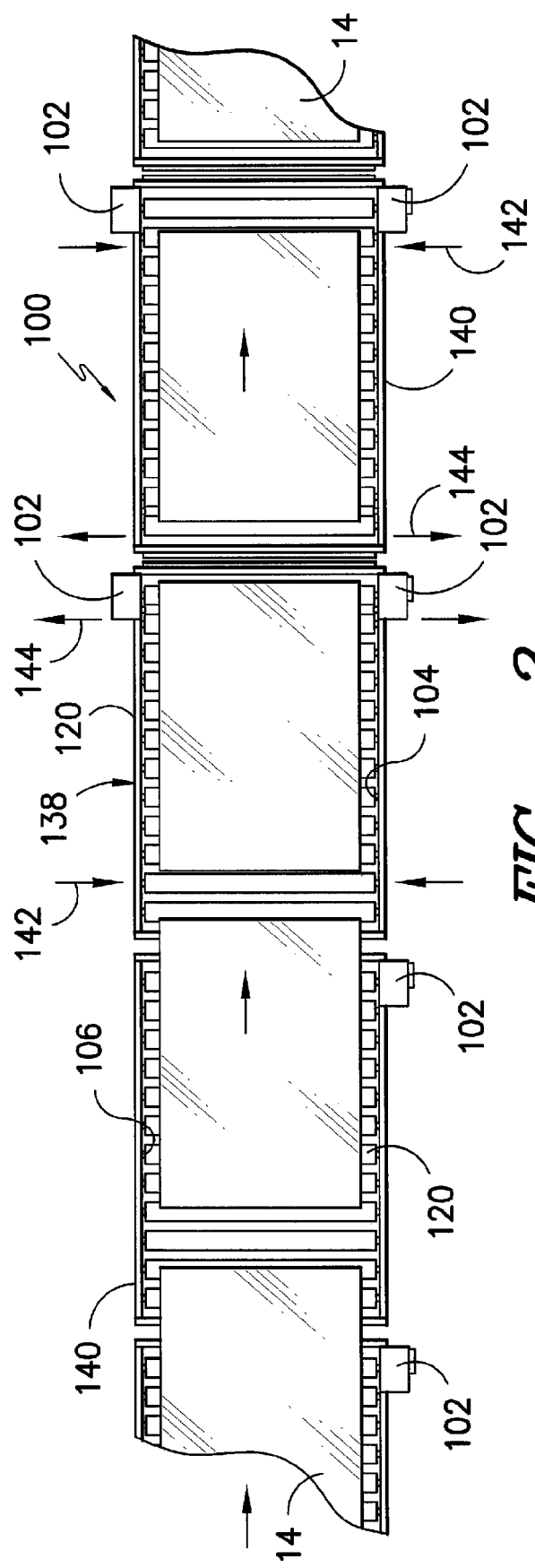
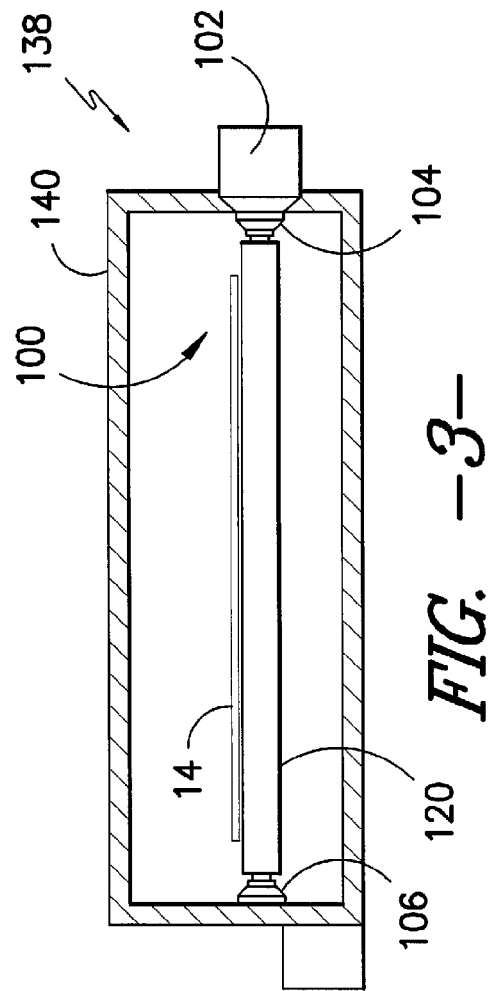

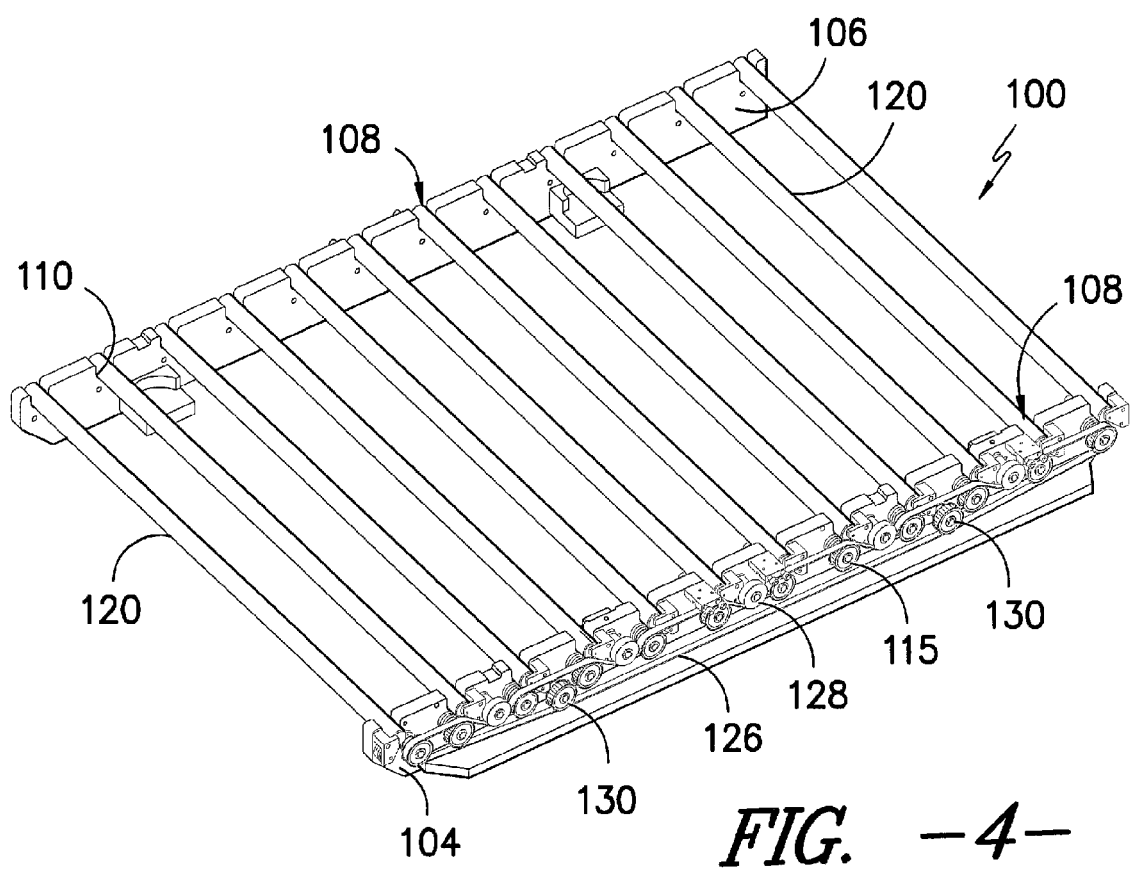
FIG. -4-
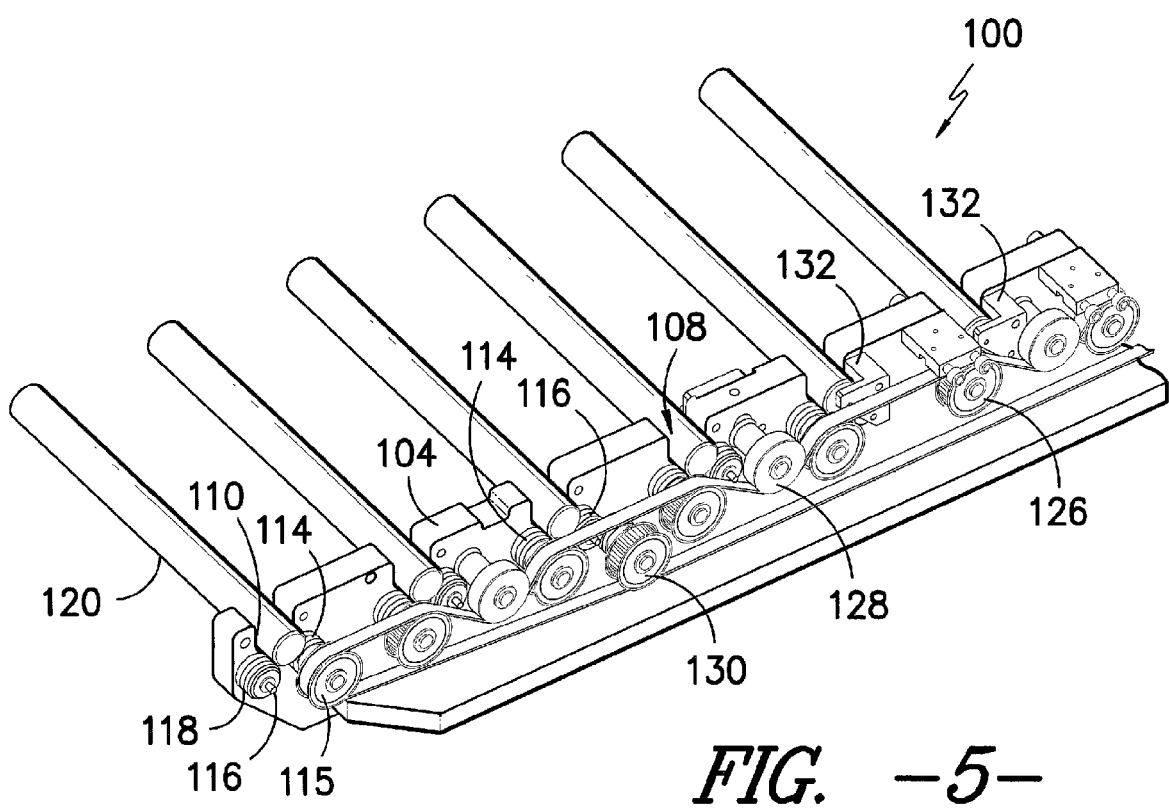
FIG. -5-

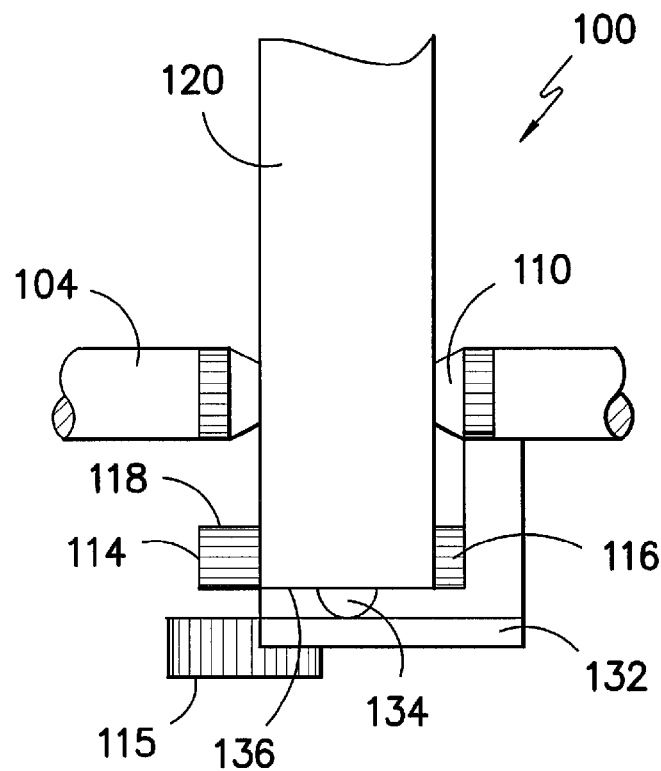
FIG. -6-
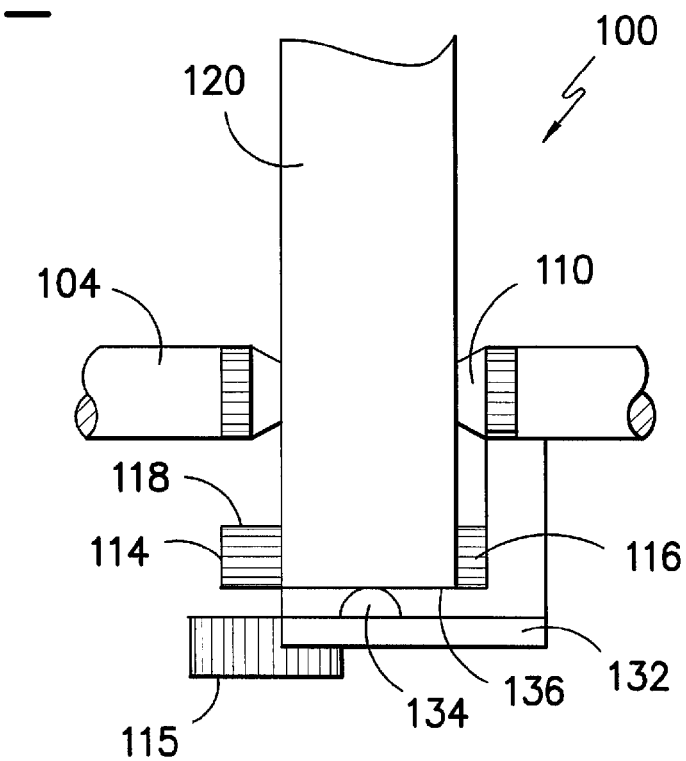
FIG. -7- dance with aspects of the present invention;
CONVEYOR ASSEMBLY WITH REMOVABLE ROLLERS FOR A VAPOR DEPOSITION SYSTEM

FIELD OF THE INVENTION

The present invention relates generally to the field of thin film vapor deposition systems wherein a thin film layer, such as a semiconductor layer, is deposited on a substrate conveyed through the system. More particularly, the invention is related to a conveyor system used to move the substrates through a vapor deposition system.

BACKGROUND OF THE INVENTION

Production of thin film photovoltaic (PV) modules (also referred to as "solar panels") typically involves conveyance of a substrate, such as a glass panel, into and out of a vapor deposition chamber wherein a thin film layer (generally recognized in the industry as less than 10 µm) of a semiconductor material, such as cadmium telluride (CdTe) is deposited onto the surface of the substrate. The deposition process may be any known process, for example a close space sublimation (CSS) system, a chemical vapor deposition (CVD) system, or physical vapor deposition (PVD) system.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner. In this regard, it is highly desirable to reduce down-time of the vapor deposition system used in production of the PV modules.

Typically, various types of conveyors are utilized to move the PV module substrates through the vapor deposition system. Components of the conveyors may be exposed to the source material vapors, which can condense into a detrimental buildup of the source material on the conveyor components. In this situation, the conveyor components need to be removed and cleaned or replaced with clean components. The conveyor components may also need to be removed for periodic maintenance, replacement, or other procedures requiring shutdown of the system. Reduction of system downtime associated with conveyor maintenance, replacement, or other reasons is an ongoing concern.

Accordingly, there exists a need for an improved conveyor assembly particularly suited for conveyance of substrates conveyed through a vapor deposition that reduces downtime associated with component replacement and maintenance. The present invention relates to a conveyor assembly that serves this purpose.

BRIEF DESCRIPTION OF THE INVENTION

Aspects and advantages of the invention will be set forth in part in the following description, or may be obvious from the description, or may be learned through practice of the invention.

An embodiment of a conveyor assembly in accordance with aspects of the invention for conveying substrates through a vapor deposition system includes a first carriage rail disposed at a drive side of the conveyor assembly, and a second carriage rail disposed at an opposite side of the conveyor assembly. The opposite side may be a non-driven idler side, or may also be a drive side. Each of the first and second carriage rails include a plurality of roller positions spaced longitudinally along the length of the rails. In a particular embodiment, these roller positions may be open-ended recesses defined in the rails. The first and second carriage rails also include a pair of wheels at each of the roller positions. These wheels are spaced apart so as to define a cradle at each respective roller position. A plurality of the roller positions along at least the first carriage rail are drive positions wherein one of the wheels is a drive wheel. The other wheel may be an idler wheel, or may also be a drive wheel. A plurality of rollers extend between the first and second carriage rails. The rollers have ends that drop into the cradles at the roller positions defined by the wheels, which rotationally support and drive the rollers. The rollers are removable from the carriage rails by being lifted out of the cradles at the roller positions.

Variations and modifications to the embodiment of the conveyor assembly discussed above are within the scope and spirit of the invention and may be further described herein.

The invention also encompasses various embodiments of a vapor deposition module that may be used for conveying a substrate through a vapor deposition system wherein a source material is sublimated (i.e., converted to vapor) and deposited onto a surface of the substrate. An embodiment of such a module includes a housing and a conveyor assembly operably configured within the housing to convey substrates through the housing. The conveyor assembly may be configured as discussed above.

Variations and modifications to the embodiment of the vapor deposition module discussed above are within the scope and spirit of the invention and may be further described herein.

The invention also encompasses a vapor deposition system configured depositing source material vapors onto a surface of a substrate conveyed through the system. Embodiments of this system may include a plurality of individual, longitudinally aligned modules designed for performing a particular function in the overall deposition process. Each module defines a conveyance path for substrates conveyed through the system and includes a housing and a conveyor assembly operably configured within the housing to convey the substrates through the housing. The conveyor assembly may be configured as discussed above in a particular embodiment.

Variations and modifications to the embodiment of the vapor deposition system discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a view of a vapor deposition system that may incorporate modules having conveyor assemblies in accordance with aspects of the present invention;

FIG. 2 is a top view of modules that incorporate embodiments of conveyor assemblies in accordance with aspects of the present invention;

FIG. 3 is a side cut-away view of one of the conveyor modules depicted in FIG. 2;

FIG. 4 is a perspective view of an embodiment of a conveyor assembly;

FIG. 5 is an enlarged perspective view of portions of the embodiment of FIG. 4;

FIG. 6 is a top view of a point contact configuration at an axial end of a roller in accordance with one embodiment; and, FIG. 7 is a top view of an alternate embodiment of a point contact configuration.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate various embodiments of a conveyor assembly 100 in accordance with aspects of the invention, particularly as components of various types of modules that make up the system 10. For reference and an understanding of an environment in which the present conveyor assemblies 100 may be used, the system 10 of FIG. 1 is described below, followed by a detailed description of particular embodiments of the conveyor assemblies 100.

The system 10 is configured for deposition of a thin film layer on a photovoltaic (PV) module substrate 14 (referred to hereafter as "substrate"). The thin film may be, for example, a film layer of cadmium telluride (CdTe). As mentioned, it is generally recognized in the art that a "thin" film layer on a PV module substrate is generally less than about 10 microns (μm). It should be appreciated that the conveyor assemblies 100 are not limited to use in the system 10 illustrated in FIG. 1, but may be incorporated into any suitable processing line configured for vapor deposition of a thin film layer onto a PV module substrate 14.

Referring to FIG. 1, the exemplary system 10 includes a vacuum chamber 12 defined by a plurality of interconnected modules. Any combination of vacuum pumps 40 may be configured with the interconnected modules to draw and maintain a vacuum effective for the deposition process within the chamber 12. A plurality of interconnected heater modules 16 define a pre-heat section of the vacuum chamber 12 through which the substrates 14 are conveyed and heated to a desired temperature before being conveyed into a vapor deposition apparatus 60. Each of the heater modules 16 may include a plurality of independently controlled heaters 18, with the heaters defining a plurality of different heat zones. A particular heat zone may include more than one heater 18. The heaters 18 may be disposed above or below the module bodies.

The vapor deposition apparatus 60 may take on various configurations and operating principles within the scope and spirit of the invention, and is generally configured for vapor deposition of a source material, such as CdTe, as a thin film on the PV module substrates 14. In the embodiment of the system 10 illustrated in FIG. 1, the apparatus 60 is a module that includes a casing in which the internal components are contained, including a vacuum deposition head mounted above a conveyor assembly. The conveyor assembly in the apparatus 60 may be in accordance with aspects of the present invention, or may be another type of conveyor that is particularly designed for the vapor deposition process within the apparatus 60.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of source material deposited thereon are allowed to cool at a controlled cool-down rate prior to the substrates 14 being removed from the system 10. Each of the modules 20 may include a forced cooling system wherein a cooling medium, such as chilled water, refrigerant, or other medium is pumped through cooling coils configured with the modules 20.

In the illustrated embodiment of system 10, at least one post-heat module 22 is located immediately downstream of the vapor deposition apparatus 60 and before the cool-down modules 20. As the leading section of a substrate 14 is conveyed out of the vapor deposition apparatus 60, it moves into the post-heat module 22, which maintains the temperature of the substrate 14 at essentially the same temperature as the remaining portion of the substrate 14 within the vapor deposition apparatus 60. In this way, the leading section of the substrate 14 is not allowed to cool while the trailing section of the substrate 14 is still within the vapor deposition apparatus 60. If the leading section of a substrate 14 were allowed to cool as it exited the apparatus 60, a non-uniform temperature would be generated longitudinally along the substrate 14. This condition could result in the substrate breaking from thermal stress.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor module 26, and are subsequently moved into an entry vacuum lock station that includes a load module 28 and a buffer module 30. A "rough" (i.e., initial) vacuum pump 32 is configured with the load module 28 to draw an initial vacuum, and a "fine" (i.e., high) vacuum pump 38 is configured with the buffer module 30 to increase the vacuum in the buffer module 30 to essentially the vacuum within the vacuum chamber 12. Valves 34 (e.g., gate type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 (starting at atmospheric pressure) into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor module 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a coordinated conveyor system configured to move the substrates 14 into, through, and out of the vacuum chamber 12. In the illustrated embodiment, this conveyor system includes a plurality of individually controlled conveyor assemblies 100, with each of the various modules in the system 10 including one of the conveyor assemblies 100. All or any combination of these conveyor assemblies 100 may be configured in accordance with aspects of the invention, as described in greater detail below. The respective conveyor assemblies 100 include conveyor drive units 102 that control the conveyance rate of substrates 14 through the respective module.

As described, each of the various modules and respective conveyors in the system 10 are independently controlled to perform a particular function. For such control, each of the individual modules may have an associated independent controller 50 configured therewith to control the individual functions of the respective module, including the conveyance rate of the conveyor assemblies 100. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, and so forth, in processing of the substrates 14 through the system 10.

Referring to FIG. 1, for independent control of the functions performed by the modules within the overall system configuration 10, including individual control of the respective conveyor assemblies 100, the modules include active-sensing viewport assemblies 54 that detect the presence of the substrates 14 as they are conveyed through the module. The viewport assemblies 54 are in communication with the respective module controller 50, which is in turn in communication with the central controller 52. The viewport assemblies 54 may be in direct communication with the central controller 52 in an alternate embodiment. In this manner, the individual respective conveyor assemblies 100 may be controlled to ensure that a proper spacing between the substrates 14 is maintained and that the substrates 14 are conveyed at the desired constant conveyance rate through the vacuum chamber 12. It should be appreciated that the viewport assemblies may be used for any other control function related to the individual modules or overall system 10.

FIGS. 2 and 3 illustrate an embodiment of a conveyor assembly 100 configured with individual modules 138. These modules 138 may be, for example, any one or combination of the modules 26, 28, 16, 30, 22, 20, 42, 44, and 46 discussed above with respect to FIG. 1. It should thus be appreciated that the conveyor assembly 100 is not limited to any particular type of module or other functioning device.

The respective conveyor assemblies 100 include at least one drive unit 102 configured with the modules 138. In the embodiment illustrated in FIG. 2, a drive unit 102 is illustrated on each respective longitudinal side of the first two modules 138 (right-hand modules) to illustrate that each longitudinal side is a drive side wherein the rollers 120 are rotationally driven at the roller positions along each longitudinal side of the assembly 100. The two left-hand assemblies 138 in FIG. 2 are illustrated with a single drive unit 102 on one longitudinal side of the modules 138. This represents that the rollers 120 are driven along one longitudinal side. The opposite ends of the rollers 120 are carried in idler wheels, as discussed in greater detail below.

The conveyor assemblies 100 are not limited to any particular type or configuration of drive unit 102. In this regard, the drive unit 102 is generically depicted in the figures. In a particular embodiment described herein, the drive unit 102 may be a motor that serves to drive a drive belt 126 (FIGS. 4 and 5) in an endless loop, as described in greater detail below.

Referring to FIGS. 2 through 5 in general, the conveyor assemblies 100 include a first carriage rail 104 at a drive side of the conveyor assembly 100, and a second carriage rail 106 disposed at an opposite side of the conveyor assembly 100. The first and second carriage rails 104, 106 include a plurality of distinct roller positions 108 spaced longitudinally along the length of the respective rails. These roller positions 108 may be defined by, for example, open-ended recesses 110 that may have a generally U-shaped profile. The recesses 110 have dimensions (slightly larger than the roller diameter) for receipt of the ends of a plurality of rollers 120, as depicted in FIGS. 4 and 5.

The first and second carriage rails 104, 106 may be formed of any suitable material configured for the particular type of environment in which the conveyor assembly 100 is intended. In an embodiment wherein the conveyor assemblies 100 are used in a relatively high temperature vacuum deposition system 10, as described above with respect to FIG. 1, it may be desired to internally cool the carriage rails 104, 106 with a forced circulation cooling medium. FIG. 2 depicts a coolant inlet 142 and a coolant outlet 144 for this purpose. The carriage rails 104, 106 may include any manner of internal cooling channels through which a cooling medium, such as chilled water, refrigerant, gas, or the like, circulates in order to maintain the components at an effective temperature for sustained operation in their intended environment.

Referring particularly to FIGS. 4 and 5, the first and second carriage rails 104, 106 include a pair of wheels at each of the roller locations 108. If the carriage rail is at a drive side of the conveyor assembly, then a plurality of the roller positions 108 are drive positions wherein at least one of the wheels is a drive wheel 114 and the other wheel may be an idler wheel 116. Desirably, each roller 120 includes at least one drive wheel, which may be at the roller location 108 at either the first or second carriage rails 104, 106. It should also be appreciated that not every roller position 108 need be a drive position. For example, idler positions may be interspaced between drive positions along either or both of the carriage rails 104, 106. In other words, even for drive sides of the conveyor assembly, not every roller 120 needs to be driven. In the illustrated embodiments, each of the roller positions 108 along the first carriage rail 104 is a drive position.

The wheels 114, 116 are disposed relative to the bottom of the respective recesses 110 so as to define a cradle for the rollers 120. In other words, the rollers 120 rest on the wheels 114, 116 without contacting the walls of the recesses 110. The wheels 114, 116 serve to rotationally support and drive the respective rollers 120. For this purpose, the wheels 114, 116 may include a grip-enhancing surface 118, such as a rubber-like coating, series of o-rings, flat rubber ring and the like. The surface 118 serves to reduce rotational slippage between the rollers 120 and the respective wheels 114, 116.

Referring to FIGS. 4 and 5 in particular, the drive wheel 114 at each of the roller positions 108 is configured with a drive pulley 115 that extends beyond the face of the drive wheel 114. These drive pulleys 115 may be wheels engaged by a tensioned drive belt 126. The drive belt 126 runs in an endless loop path along the length of the first carriage rail 104 and engages the plurality of drive pulleys 115, as particularly illustrated in FIG. 5. In order to maintain a proper tension on the drive belt 126, one or more adjustable tension rollers 128 may be provided along the length of the carriage rail 104. Likewise, any number of return wheels 130 may be provided to ensure proper guidance and deflection of the drive belt 126 along its return path. The drive pulleys 115 and return wheels 130 may also include any configuration of traction-enhanced surface for engagement with the drive belt 126. For example, the pulleys 115 and return wheels 130 may include a knurled surface or any other type of surface that is compatible with the surface of the drive belt 126 to ensure sufficient traction between the drive belt 126 and the respective wheels. In the illustrated embodiment wherein a cogged belt and cogged wheels are used, generally no slippage occurs between the components.

As seen in FIGS. 4 and 5, a plurality of rollers 120 extend between the first carriage rail 104 and the second carriage rail 106. The ends of the rollers 120 essentially drop into the cradles defined by the wheels 114, 116 at the respective roller positions 108. The rollers are easily and readily removable from the rails 104, 106 for repair, replacement, or any other reason simply by lifting the rollers 120 vertically out of the roller positions 108. The rollers may be formed of any suitable material, such as ceramic, aluminum, steel, and the like.

The drive units 102 may be configured to drive the belt 126 in its endless-loop path by any suitable mechanical configuration. For example, the drive unit 102 may include a motor that is rotationally engaged with one or more of the drive pulleys 115 through any suitable gearing arrangement. In an alternate embodiment, a separate drive pulley may be provided anywhere along the path of the belt 126 to drive the belt in its endless-loop path. It should be readily appreciated that various suitable drive arrangements are within the scope and spirit of the invention for this purpose.

As mentioned above with respect to the discussion of FIGS. 4 and 5, it is not necessary that the second carriage rail 106 include drive wheels 114 at the respective roller positions 108. The positions 108 along the second carriage rail 106 may simply include a pair of non-driven idler wheels 116 at each of the rollers positions 108 to define the cradle for the ends of the rollers 120. Alternatively, it may be desired to include a respective drive unit 102 configured with the second carriage rail 106 in the same type of configuration described above with respect to the first carriage rail 104.

FIG. 5 illustrates a contact member 132 configured with the roller positions 108 in the right-hand side of the illustration. These contact members 132 have been removed from the other roller positions 108 for sake of illustration. The contact members 132 define a contact bearing surface for axial end faces 136 of the rollers 120, as particularly illustrated in FIGS. 6 and 7. In the embodiment of FIG. 6, a point contact is defined by a protrusion 134, such as a nub or other member, defined concentrically on the axial end face 136 of the roller 120. This protrusion 134 bears against the contact member 132 to prevent axial creeping of the rollers relative to the first carriage rail 104. The same or similar configuration may be provided at the roller positions 108 along the second carriage roll 106 for the same purpose.

In the embodiment of FIG. 7, the point contact is defined by a nub or other protrusion 134 defined on the inner face of the contact member 132 that is opposite from the axial face 136 of the roller 120. The principle of operation is the same as described above with respect to FIG. 6.

Although not depicted in the figures, it should be appreciated that any manner of other structure may be disposed along the top surface of the respective rails 104, 106 to prevent inadvertent ejection of the rollers from the respective roller positions 108. The structure may be, for example, shielding, a lock bar, or any other type of readily removable structure. If such structure is provided, then the structure would need to be removed from the rails 104, 106 for subsequent removal of the rollers 120.

As mentioned, the present invention also encompasses any manner of vapor deposition modules for use in conveying a substrate 14 through a vapor deposition system, such as the system 10 in FIG. 1 wherein a source material is converted to a vapor and deposited onto a surface of the substrates 14. Referring to FIGS. 2 and 3 for example, any manner of such modules 138 includes housing structure 140 in which the conveyor assembly 100 is operationally configured. The housing structure 140 may include side walls, with the carriage rails 104, 106 mounted between the side walls. The conveyor assembly 100 configured within the housing structure 140 may be in accordance with any of the embodiments described above.

Similarly, the present invention also encompasses a vapor deposition system, such as the system 10 described above with respect to FIG. 1, for converting to vapor and depositing a source material onto a surface of substrates 14 conveyed through the system. The system 10 may include a plurality of individual, longitudinally aligned modules that define a conveyance path for the substrates 14 conveyed through the system 10. The modules may be any one or combination of the different types of modules described above with respect to FIG. 1. The modules and respective conveyor assemblies 100 may be in accordance with any one of the embodiments described above.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A conveyor assembly for conveying substrates through a vapor deposition system, said conveyor assembly comprising:

a first carriage rail disposed at a drive side of said conveyor assembly, and a second carriage rail disposed at an opposite side of said conveyor assembly;

said first carriage rail and said second carriage rail comprising a plurality of roller positions spaced longitudinally therealong;

said first carriage rail and said second carriage rail further comprising a pair of wheels at each of said roller positions, said wheels spaced apart so as to define a cradle at said respective roller position;

a plurality of said roller positions on said first carriage rail being drive positions wherein at least one of said wheels at said roller position is a driven wheel; and, a plurality of rollers extending between said first carriage rail and said second carriage rail, said rollers having ends that drop into said cradles at said roller positions such that said rollers are removable from said first carriage rail and said second carriage rail by being lifted out of said cradles at said roller positions, wherein said driven wheel is configured to rotate said roller in the drive position such that substrates positioned thereon are conveyed longitudinally therealong the conveyor assembly.

2. The conveyor assembly as in claim 1, wherein said roller positions are defined by open-ended recesses defined in said first carriage rail and said second carriage rail, said pair of wheels defining said cradles at a bottom of said recesses such that said rollers do not contact walls of said recess.

3. The conveyor assembly as in claim 2, wherein said driven wheels along said first carriage rail are rotationally driven by a common drive belt, said driven wheels further comprising a grip-enhanced circumferential surface for increased traction with said drive belt.

4. The conveyor assembly as in claim 3, further comprising at least one adjustable tension roller configured on said first carriage rail around which said drive belt at least partially runs.

5. The conveyor assembly as in claim 3, wherein said drive belt runs in an endless loop path, and further comprising at least one return wheel around which said drive belt at least partially runs in a return portion of said endless loop path.

6. The conveyor assembly as in claim 1, further comprising an axial contact member disposed at each of said roller positions along said first carriage rail and said second carriage rail, said contact members configured and disposed for contact with axial end faces of said rollers to prevent axial movement of said rollers with respect to said first carriage rail and said second carriage rail.

7. The conveyor assembly as in claim 6, further comprising a point contact surface configured between said contact members and said axial faces of said rollers.

8. The conveyor assembly as in claim 1, wherein said roller positions along said second carriage rail are non-drive positions, and wherein said wheels at said roller positions along said second carriage rail are non-driven idler wheels.

9. The conveyor assembly as in claim 1, wherein a plurality of said roller positions along said second carriage rail are drive positions wherein at least one of said wheels is a driven wheel.

10. A vapor deposition module for use in conveying a substrate through a vapor deposition system wherein a source material is converted to a vapor and deposited onto a surface of the substrate, said module comprising:
a housing configured to sublimate the source material into the vapor;
a conveyor assembly operably configured within said housing to convey a substrate through said housing such that the vapor deposits onto the surface of the substrate, said conveyor assembly comprising
a first carriage rail disposed at a drive side of said conveyor assembly, and a second carriage rail disposed at an opposite side of said conveyor assembly;
said first carriage rail and said second carriage rail comprising a plurality of roller positions spaced longitudinally therealong;
said first carriage rail and said second carriage rail further comprising a pair of wheels at each of said roller positions, said wheels spaced apart so as to define a cradle at said respective roller position;
a plurality of said roller positions along said first carriage rail being drive positions wherein at least one of said wheels is a driven wheel; and,
a plurality of rollers extending between said first carriage rail and said second carriage rail, said rollers having ends that drop into said cradles at said roller positions such that said rollers are removable from said first carriage rail and said second carriage rail by being lifted out of said cradles at said roller positions, wherein the plurality of rollers are configured to convey substrates positioned thereon in a direction that is substantially perpendicular to the drive side.

11. The module as in claim 10, wherein said roller positions are defined by open-ended recesses defined in said first carriage rail and said second carriage rail, said wheels defining said cradles at a bottom of said recesses such that said rollers do not contact walls of said recess.

12. The module as in claim 11, wherein said driven wheels along said first carriage rail are rotationally driven by a common drive belt, said driven wheels further comprising a grip-enhanced circumferential surface for increased traction with said drive belt.

13. The module as in claim 12, further comprising at least one adjustable tension roller configured on said first carriage rail around which said drive belt at least partially runs.

14. The module as in claim 12, wherein said drive belt runs in an endless loop path, and further comprising at least one return wheel around which said drive belt at least partially runs in a return portion of said endless loop path.

15. The module as in claim 12, further comprising a drive unit configured on said housing to drive said drive belt.

16. The module as in claim 10, further comprising an axial contact member disposed at each of said roller positions along said first carriage rail and said second carriage rail, said contact members configured and disposed for contact with axial end faces of said rollers to prevent axial movement of said rollers with respect to said first carriage rail and said second carriage rail, and further comprising a point contact surface configured between said contact members and said axial faces of said rollers.

17. The module as in claim 10, wherein said roller positions along said second carriage wheel are non-drive positions, and wherein said wheels at said roller positions along said second carriage rail are non-driven idler wheels.

18. A vapor deposition system configured for converting to vapor and depositing a source material onto a surface of a substrate conveyed through said system, said system comprising:
a plurality of individual, longitudinally aligned modules, said modules defining a conveyance path for substrates conveyed through said system, each of said modules comprising
a housing;
a conveyor assembly operably configured within said housing to convey the substrate through said housing, said conveyor assembly comprising
a first carriage rail disposed at a drive side of said conveyor assembly, and a second carriage rail disposed at an opposite side of said conveyor assembly;
said first carriage rail and said second carriage rail comprising a plurality of roller positions spaced longitudinally therealong;
said first carriage rail and said second carriage rail further comprising a pair of wheels at each of said roller positions, said wheels spaced apart so as to define a cradle at said respective roller position;
a plurality of said roller positions along said first carriage rail being drive positions wherein at least one of said wheels is a driven wheel; and,
a plurality of rollers extending between said first carriage rail and said second carriage rail, said rollers having ends that drop into said cradles at said roller positions such that said rollers are removable from said first carriage rail and said second carriage rail by being lifted out of said cradles at said roller positions, wherein the plurality of rollers are configured to convey substrates positioned thereon in a direction that is substantially perpendicular to the drive side, and wherein one of said modules comprises a vapor deposition apparatus configured to sublimate the source material and deposit the vapor onto the substrate conveyed therethrough.

19. The system as in claim 18, wherein said roller positions are defined by open-ended recesses defined in said first carriage rail and said second carriage rail, said wheels defining said cradles at a bottom of said recesses, said driven wheels along said first carriage rail rotationally driven by a common drive belt, and farther comprising a drive unit configured on said housing to drive said drive belt.

20. The system as in claim 19, further comprising a controller configured with each of said modules, said drive unit in communication with said controller for varying a drive speed of said driven rollers.

* * * * *